(12) United States Patent
Yoon et al.

(10) Patent No.: US 8,817,518 B2
(45) Date of Patent: Aug. 26, 2014

(54) E-FUSE ARRAY CIRCUIT AND PROGRAMMING METHOD OF THE SAME

(75) Inventors: Hyunsu Yoon, Gyeonggi-do (KR); Yongho Seo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 112 days.

(21) Appl. No.: 13/601,302

(22) Filed: Aug. 31, 2012

(65) Prior Publication Data

US 2014/0063894 A1    Mar. 6, 2014

(51) Int. Cl.
*G11C 17/00* (2006.01)
*G11C 7/00* (2006.01)
*G11C 17/18* (2006.01)
*G11C 8/00* (2006.01)

(52) U.S. Cl.
USPC .............. 365/96; 365/189.07; 365/225.7; 365/230.06

(58) Field of Classification Search
USPC ............ 365/96, 189.07, 225.7, 230.06
See application file for complete search history.

(56) References Cited

U.S. PATENT DOCUMENTS

| 7,035,158 B2 * | 4/2006 | Kozuka ................. 365/225.7 |
| 7,095,671 B2 * | 8/2006 | Krishnan et al. ........ 365/225.7 |
| 7,269,047 B1 | 9/2007 | Fong et al. |
| 7,936,582 B1 * | 5/2011 | Zhou et al. ................. 365/96 |

* cited by examiner

*Primary Examiner* — Trong Phan
(74) *Attorney, Agent, or Firm* — IP & T Group LLP

(57) ABSTRACT

A program method for an e-fuse array circuit includes receiving an address and a multi-bit program data, programming the multi-bit program data in e-fuses designated by the address, reading a multi-bit read data from the e-fuses, and comparing bits of the multi-bit program data with bits of the multi-bit read data, wherein if the bits of the multi-bit program data are identical to the bits of the multi-bit read data, a program operation is terminated; and if the bits of the multi-bit read data are not identical to the bits of the multi-bit program data, then the programming of the multi-bit program data, the reading of the multi-bit read data, and the comparing of the bits are performed again.

9 Claims, 5 Drawing Sheets

E-FUSE ARRAY CIRCUIT AND PROGRAMMING METHOD OF THE SAME

BACKGROUND

1. Field

Exemplary embodiments of the present invention relate to an e-fuse array circuit, and more particularly, to a technology for improving a programming method of an e-fuse array circuit.

2. Description of the Related Art

A general fuse recognizes a data based on whether the fuse is cut by a laser or not. Therefore, it is possible to set a fuse in the stage of wafer, but after the wafer is mounted on a package, the fuse cannot be programmed.

To overcome the drawback, an e-fuse is used. The e-fuse stores a data by using a transistor and changing the resistance between a gate and a drain/source of the transistor.

FIG. 1 illustrates an e-fuse including a transistor, where the e-fuse operates as either a resistor or a capacitor.

Referring to FIG. 1, the e-fuse includes a transistor T, and a power source voltage is supplied to a gate G while a ground voltage is supplied to a drain/source D/S.

If a power source voltage of an ordinary level that the transistor T may tolerate is applied to the gate G, then the e-fuse may operate as a capacitor C. Therefore, no current flows between the gate G and the drain D or the source S. However, if a high voltage that the transistor T may not tolerate is applied to the gate G, then the gate oxide of the transistor T is destroyed to short the gate G and the drain source D/S. As a result, the e-fuse may operate as a resistor R. Therefore, current flows between the gate G and the drain/source D/S.

Based on these results, the data of the e-fuse is recognized from the resistance value between the gate G and the drain/source D/S. The data of the e-fuse may be recognized by (1) enlarging the size of the transistor T, or (2) using an amplifier, instead of increasing the size of the transistor T, and sensing the current flowing through the transistor T. If the transistor T is enlarged, the data of the e-fuse may be recognized without performing a sensing operation. The above two methods, however, have concerns regarding dimensional restrictions because the transistor T that constitutes the e-fuse has to be enlarged or each e-fuse has to be equipped with an amplifier for amplifying data.

U.S. Pat. No. 7,269,047 discloses a technology for forming an e-fuse in a type of an e-fuse array in order to reduce the area occupied by the e-fuse.

FIG. 2 is a block view illustrating a conventional cell array 200 formed of e-fuses.

Referring to FIG. 2, the cell array 200 includes memory cells 201 to 216 arrayed in N rows and M columns. The memory cells 201 to 216 include memories M1 to M16 and switches S1 to S16, respectively. The memories M1 to M16 are e-fuses having the characteristics of resistors or capacitors based on whether they are ruptured or not. In other words, the memories M1 to M16 may be regarded as resistive memories that store data based on the intensity of resistance. The switches S1 to S16 may electrically connect the memories M1 to M16 with column lines BL1 to BLM under the control of row lines WLR1 to WLRN.

Hereafter, it is assumed that a second row is a selected row, and a $M^{th}$ column is a selected column, in other words, it is assumed that a memory cell 208 is a selected memory cell. The voltage supplied to the selected memory cell 208 and the voltage supplied to unselected memory cells 201 to 207 and 209 to 216 during a program and read operation are described below.

Program Operation

The selected row line WLR2 is enabled and the other row lines WLR1 and WLR3 to WLRN of the selected row are disabled. Therefore, switches S5 to S8 are turned on, and the other switches S1 to S4 and S9 to S16 are turned off. A high voltage (a rupture voltage) that could destroy the gate oxide of an e-fuse, which is generally generated by pumping a power source voltage, is supplied to the program/read line WLP2 of the selected row, and a low voltage, e.g., a ground voltage, is supplied to the other program/read lines WLP1 and WLP3 to WLPN. The selected column line BLM is coupled with a data access circuit, and unselected column lines BL1 to BLM-1 float. If an input data is a program data, e.g., '1', then the data access circuit drives the selected column line BLM to a low-level voltage to program (or rupture) the memory M8 of the selected memory cell 208. If the input data is not a program data, e.g., '0', the data access circuit drives the selected column line BLM to a high-level voltage so that the memory M8 of the selected memory cell 208 may not be programmed. Because the unselected column lines BL1 to BLM-1 float, the memories M5 to M7 may not be programmed even though a high voltage is applied to the gates.

Read Operation

The selected row line WLR2 is enabled, and the other row lines WLR1 and WLR3 to WLRN of the selected row are disabled. Therefore, the switches S5 to S8 are turned on, and the other switches S1 to S4 and S9 to S16 are turned off. A voltage, which is generally a power source voltage, is supplied to the program/read line WLP2 of the selected row, while a low voltage, e.g., a ground voltage, is supplied to the other program/read lines WLP1 and WLP3 to WLPN. The selected column line BLM is coupled with a data access circuit, and the unselected column lines BL1 to BLM−1 float. If current flows through the selected column line BLM, then the data access circuit may recognize that the memory M8 is programmed. In other words, the data access circuit may recognize that the data of the memory 208 as '1'. If current does not flow through the selected column line BLM, then the data access circuit may recognize that the memory M8 is not programmed. In other words, the data access circuit may recognize that the data of the memory 208 as '0'.

Although it is illustrated in the above that one column line BLN is selected among the column lines BL1 to BLN, a plurality of column lines may be selected at one time. In short, a plurality of memory cells belonging to the same row may be simultaneously programmed or read.

FIG. 3 is a block view illustrating a conventional e-fuse array circuit including the cell array 200 of FIG. 2.

Referring to FIG. 3, the e-fuse array circuit includes the cell array 200 shown in FIG. 2, a row circuit 310, a column decoding circuit 320, and a data access circuit 330.

The row circuit 310 controls row lines WLR1 to WLRN and program/read lines WLP to WLPN for the program operation and the read operation that are described above. A row address ROW_ADD inputted to the row circuit 310 designates a row that is selected among a plurality of rows, and a program/read signal PG/RD indicates a program operation or a read operation.

The column decoding circuit 320 electrically connects a column line selected based on a column address COL_ADD among column lines BL1 to BLM with the data access circuit 330. The drawing exemplarily illustrates four column lines <0>, <1>, <2>, and <3> selected among the column lines BL1 to BLM.

The data access circuit 330 controls the access of data of the column lines that are selected by the column decoding circuit 320. During a program operation, the data access circuit 330 controls the selected column lines to be programmed or not to be programmed based on an input data DI<0:3>. During a read operation, the data access circuit 330 senses whether current flows through the selected column lines or not, and it outputs the sensing result as an output data DO<0:3>.

The e-fuse array circuit may store data by destroying or not destroying the gate oxide of a transistor that constitutes an e-fuse. The gate oxide may be or may not be easily destroyed based on the characteristics of the transistor. In short, a resistive memory device may have a failure based on the characteristics of the transistor. Therefore, it is required to develop a technology that improves the reliability of a program operation of an e-fuse array circuit.

SUMMARY

Exemplary embodiments of the present invention are directed to prevent an increase in program operation time while improving the reliability of a program operation of an e-fuse array circuit.

In accordance with an exemplary embodiment of the present invention, a program method for an e-fuse array circuit includes receiving an address and a multi-bit program data, programming the multi-bit program data in e-fuses designated by the address, reading a multi-bit read data from the e-fuses, and comparing bits of the multi-bit program data with bits of the multi-bit read data, wherein if the bits of the multi-bit program data are identical to the bits of the multi-bit read data, a program operation is terminated; and if the bits of the multi-bit read data are not identical to the bits of the multi-bit program data, then the programming of the multi-bit program data, the reading of the multi-bit read data, and the comparing of the bits are performed again.

In accordance with another exemplary embodiment of the present invention, an e-fuse array circuit includes a cell array configured to include e-fuses that are arrayed in a plurality of rows and a plurality of columns, a row circuit configured to control a row operation of a row that is selected based on a row address among the multiple rows, a column circuit configured to program a multi-bit program data in columns that are selected based on a column address among the multiple columns and read a multi-bit read data from the selected columns, a comparison circuit configured to compare bits of the multi-bit program data with bits of the multi-bit read data to produce a comparison result, and a control circuit configured to control the row circuit and the column circuit to terminate or perform a program operation again on e-fuses selected based on the row address and the column address based on the comparison result of the comparison circuit.

DETAILED DESCRIPTION

Figure 1:
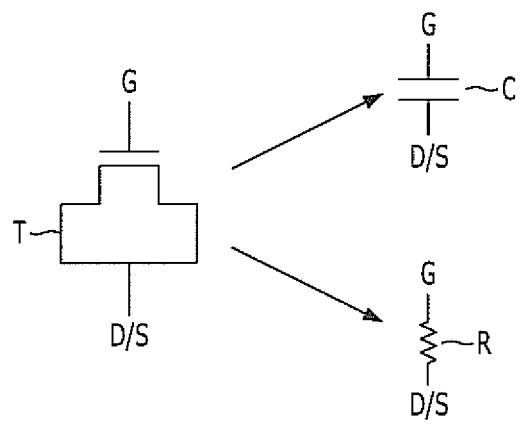
FIG. 1 is an illustration of an e-fuse including a transistor, where the e-fuse operates as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
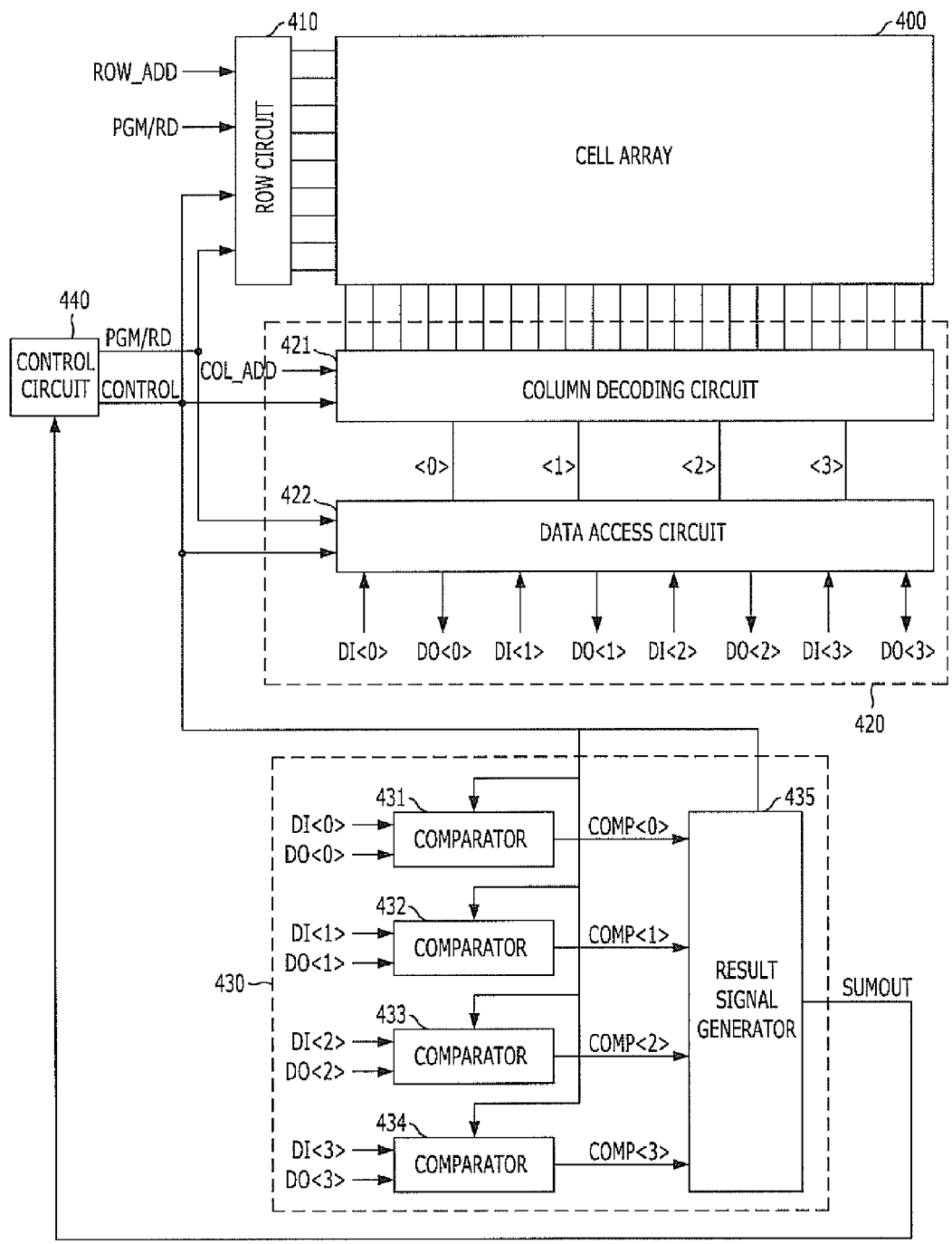
FIG. 4 is a block view illustrating an e-fuse array circuit in accordance with an embodiment of the present invention.

FIG. 4 is a block view illustrating an e-fuse array circuit in accordance with an embodiment of the present invention.

Referring to FIG. 4, the e-fuse array circuit includes a cell array 400, a row circuit 410, a column circuit 420, a comparison circuit 430, and a control circuit 440.

Figure 2:
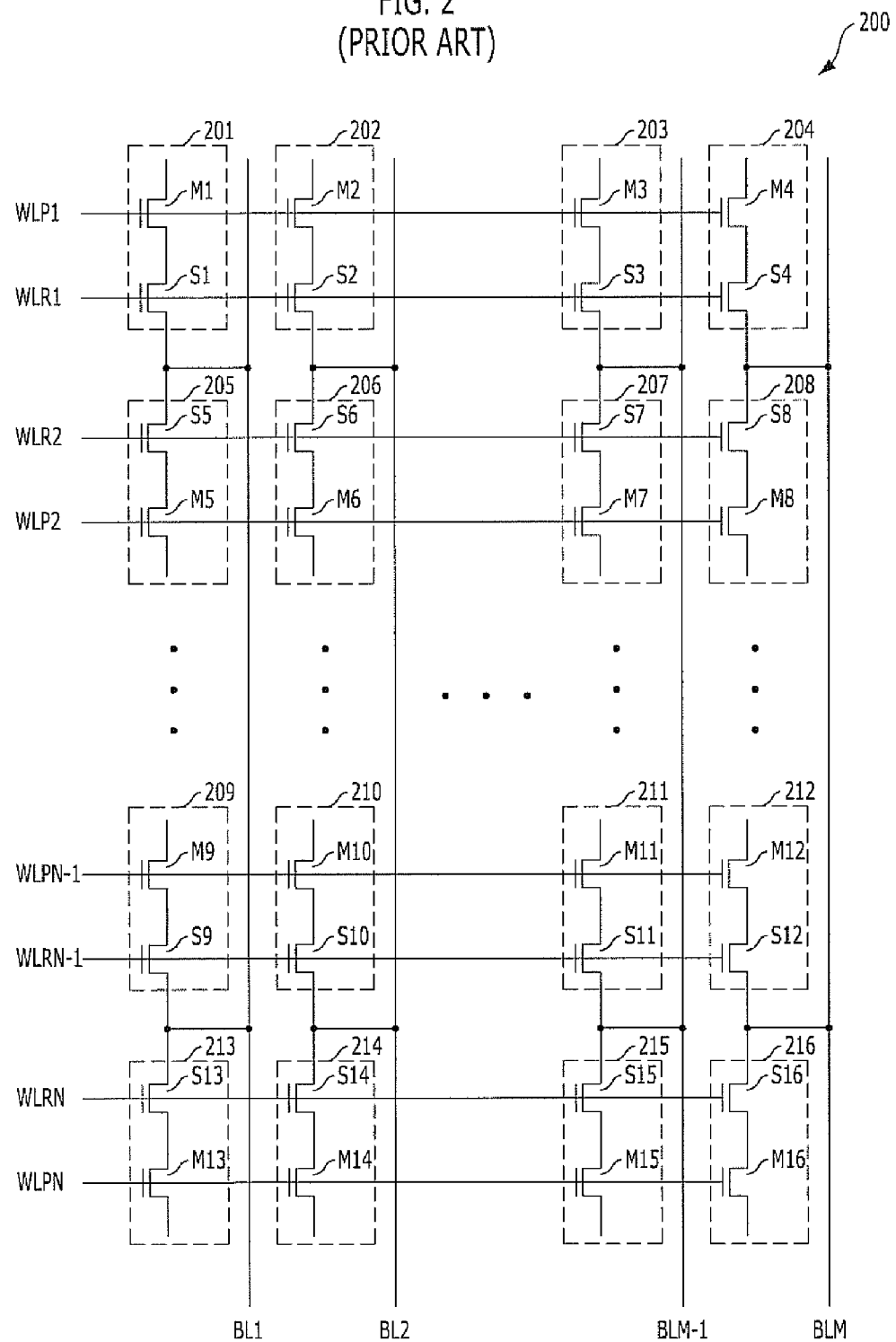
FIG. 2 is a block view illustrating a conventional cell array 200 formed of e-fuses.
Figure 3:
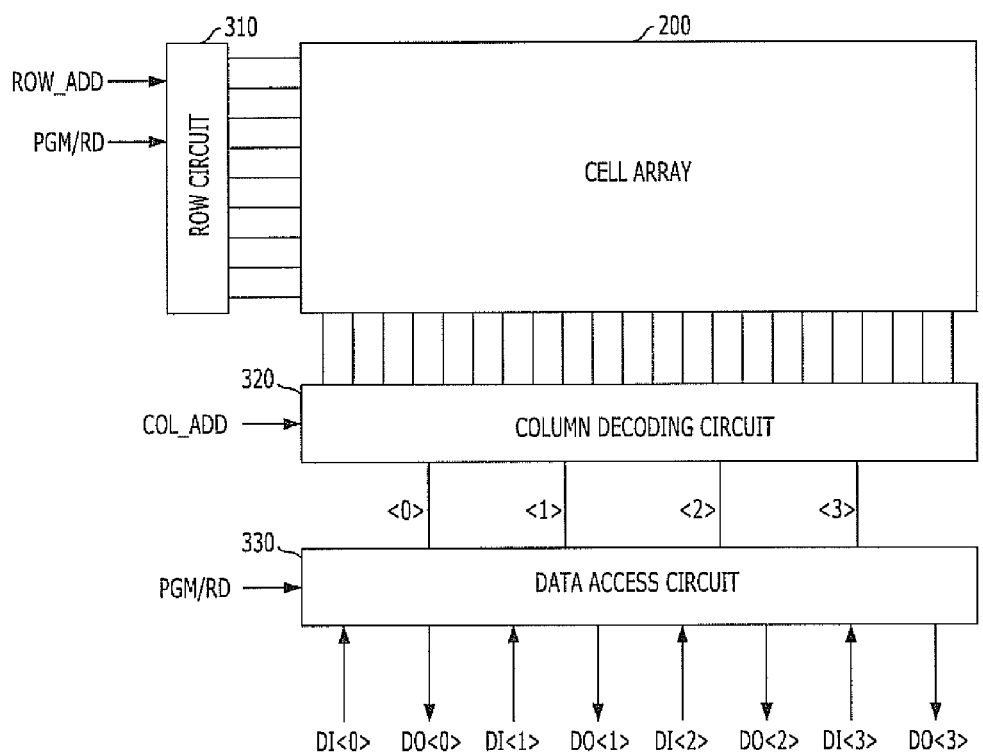
FIG. 3 is a block view illustrating a conventional e-fuse array circuit including the cell array 200 shown in FIG. 2.

The cell array 400 includes e-fuses that are arrayed in a plurality of rows and a plurality of columns. The cell array 400 may be formed as shown in FIG. 2.

The row circuit 410 may control row lines WLR1 to WLRN and program/read lines WLP to WLPN for a program operation and a read operation. A row address ROW_ADD inputted to the row circuit 410 may designate a row that is selected among a plurality of rows, and a program/read signal PGM/RD may indicate a program operation or a read operation.

The column circuit 420 may program a multi-bit program data DI<0:3> in columns that are selected based on a column address COL_ADD among a plurality of columns of the cell array 400, and may read a multi-bit read data DO<0:3> from the selected columns. The column circuit 420 may include a column decoding circuit 421 and a data access circuit 422. The column decoding circuit 421 electrically connects a column line selected based on a column address COL_ADD among column lines BL1 to BLM with the data access circuit 422. The drawing exemplarily illustrates four column lines <0>, <1>, <2>, and <3> selected among the column lines BL1 to BLM.

The data access circuit 422 may control an access of data of the column lines that are selected by the column decoding circuit 421. During a program operation, the data access circuit 422 controls the selected column lines may or may not be programmed based on an inputted multi-bit program data DI<0:3> that is inputted from the outside. During a read operation, the data access circuit 422 may sense whether current flows through the selected column lines or not, and it outputs the result obtained from sensing current flows as a multi-bit read data DO<0:3>.

The comparison circuit 430 may compare the bits of the multi-bit program data DI<0:3> with the bits of the multi-bit read data DO<0:3> and generates a result signal SUMOUT. The comparison circuit 430 includes a plurality of comparators 431 to 434 and a result signal generator 435. Each of the comparators 431 to 434 compares a one-bit program data with a one-bit read data, and outputs a comparison signal COMP<0:3> representing whether the data compared are the same or not. The comparators 431 to 434 may latch a program data DI<0:3>, and when a read data DO<0:3> is outputted, the comparators may compare the program data DI<0:3> with the read data DO<0:3>. The result signal generator 435 receives the comparison signal COMP<0:3> from the comparators 431 to 434, and generate the result signal SUMOUT representing that all the bits of the multi-bit program data DI<0:3> are the same as all the bits of the multi-bit read data DO<0:3>. The result signal SUMOUT generated in the comparison circuit 430 is transferred to the control circuit 440 to decide whether a program operation is performed again or not.

The control circuit 440 may control the row circuit 410, the column circuit 420, and the comparison circuit 430 to perform a program operation and a read operation. 'CONTROL' of FIG. 4 indicates circuits 410, 420, and 430 controlled at the control circuit 440. Hereafter, how the row circuit 410, the column circuit 420, and the comparison circuit 430 perform the program operation under the control of the control circuit 440, as suggested in an exemplary embodiment of the present invention, is described with reference to FIG. 5.

Figure 5:
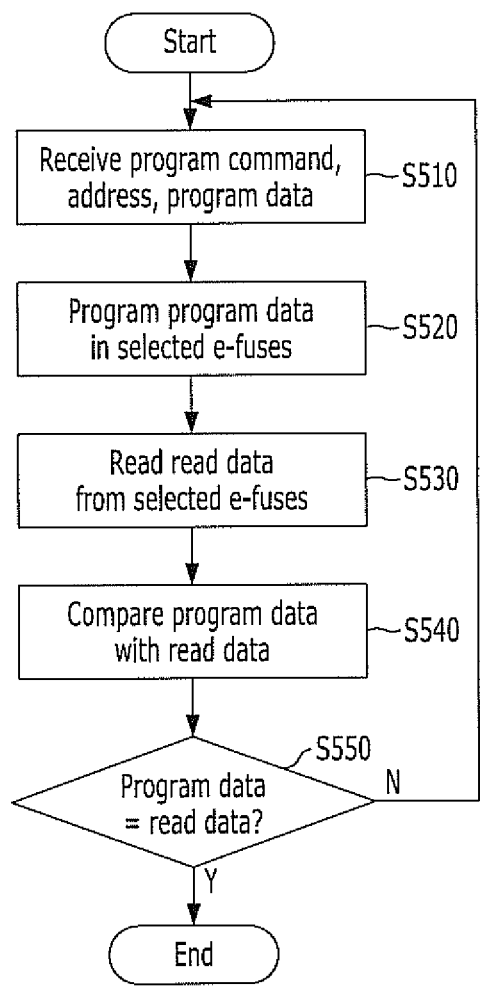
FIG. 5 is a flowchart describing a program operation of the e-fuse array circuit shown in FIG. 4 in accordance with an embodiment of the present invention.

FIG. 5 is a flowchart describing a program operation of the e-fuse array circuit shown in FIG. 4 in accordance with an embodiment of the present invention.

Referring to FIG. 5, in step S510, a source other than the e-fuse array circuit may provide a program command, an address, and a multi-bit program data corresponding to the address to the embodiment of the present invention. The address includes a row address ROW_ADD for storing a row in a cell array and a column address COL_ADD for storing a column in the cell array.

In step S520, a multi-bit program data DI<0:3> is programmed and stored in the e-fuses corresponding to the row address ROW_ADD and the column address COL_ADD. For example, the row circuit 410 may select one row based on the row address ROW_ADD and may apply a program voltage to the e-fuses of the selected row. The column circuit 420 may control the voltage level of the column lines that are selected based on the column address COL_ADD.

In step S530, a multi-bit read data DO<0:3> is read from the e-fuses in which a program operation is performed in step S520. For example, the row circuit 410 may apply a read voltage to the e-fuses of the selected row. The column circuit 420 may sense whether current flows through the selected column lines or not and generates a multi-bit read data DO<0:3>.

In step S540, the bits of the multi-bit program data DI<0:3> that is programmed in step S520 and the bits of the multi-bit read data DO<0:3> that is read in step S530 are compared with each other. The comparison between the multi-bit program data DI<0:3> and the multi-bit read data DO<0:3> may be performed through the comparison circuit 430, and as a result, the result signal SUMOUT is generated.

In step S550, a decision is made to perform a program operation again or to terminate a program operation based on the result signal SUMOUT obtained in step S540. If the multi-bit program data DI<0:3> and the multi-bit read data DO<0:3> are identical to each other, then it is decided that the data are correctly programmed in the selected e-fuses. In this case, the program operation is terminated. In other cases, a decision is made that the data are not correctly programmed in the selected e-fuses, and the processes of the steps S520 to S540 are performed again. Here, if the process of the step S520 is performed again, then a higher program voltage than the voltage used in the previous program operation may be applied.

According to the embodiment of the present invention, the multi-bit program data DI<0:3> is programmed in the e-fuses selected based on the address, and the multi-bit read data DO<0:3> is read from the e-fuses. Subsequently, decided decision is made either to perform a program operation again or to terminate a program operation by comparing the multi-bit program data DI<0:3> with the multi-bit read data DO<0:3>. Therefore, a greater reliability of the program operation may be obtained while not increasing the time taken for performing a program operation of an e-fuse array circuit.

While the present invention has been described with respect to the specific embodiments, it will be apparent to those skilled in the art that various changes and modifications may be made without departing from the spirit and scope of the invention as defined in the following claims.

What is claimed is:

1. An e-fuse array circuit, comprising:
a cell array configured to include e-fuses that are arrayed in a plurality of rows and a plurality of columns;
a row circuit configured to control a row operation of a row that is selected based on a row address among the multiple rows;
a column circuit configured to program a multi-bit program data in columns that are selected based on a column address among the multiple columns and read a multi-bit read data from the selected columns;
a comparison circuit configured to compare bits of the multi-bit program data with bits of the multi-bit read data to produce a comparison result; and
a control circuit configured to control the row circuit and the column circuit to terminate or perform a program operation again on e-fuses selected based on the row address and the column address based on the comparison result of the comparison circuit.

2. The e-fuse array circuit of claim 1, wherein if the bits of the multi-bit program data are identical to the bits of the multi-bit read data, the control circuit terminates a program operation performed on the e-fuses selected based on the row address and the column address.

3. The e-fuse array circuit of claim 2, wherein the comparison circuit includes:
a plurality of comparators for comparing the bits of the multi-bit program data and the bits of the multi-bit read data with each other to produce a comparison result; and
a result signal generator for receiving the comparison result from the comparators, and generating a result signal representing whether or not the bits of the multi-bit read data are identical to the bits of the multi-bit program data.

4. The e-fuse array circuit of claim 1, wherein the row circuit applies a program voltage to the e-fuses of the selected row during a program operation, and applies a read voltage to the e-fuses of the selected row during a read operation.

5. The e-fuse array circuit of claim 1, wherein the column circuit includes:
a column decoding circuit for selecting the selected columns; and
a data access circuit for accessing data for the selected columns.

6. A program method for an e-fuse array circuit, comprising:
receiving an address and a multi-bit program data;
programming the multi-bit program data in e-fuses designated by the address;
reading a multi-bit read data from the e-fuses; and
comparing bits of the multi-bit program data with bits of the multi-bit read data,
wherein if the bits of the multi-bit program data are identical to the bits of the multi-bit read data, a program operation is terminated; and if the bits of the multi-bit read data are not identical to the bits of the multi-bit program data, then the programming of the multi-bit program data, the reading of the multi-bit read data, and the comparing of the bits are performed again.

7. The program method of claim 6, wherein the address includes a row address and a column address.

8. The program method of claim 7, wherein the programming of the multi-bit program data in the e-fuses designated by the address includes:
- selecting one row based on the row address among a plurality of rows inside the e-fuse array circuit
- selecting columns based on the column address among a plurality of columns inside the e-fuse array circuit;
- applying a rupture voltage to e-fuses of the selected row; and
- controlling a voltage level of column lines that are coupled with e-fuses of the selected columns based on a logic level of the multi-bit program data.

9. The program method of claim 8, wherein the reading of the multi-bit read data from the e-fuses includes:
- applying a read voltage to e-fuses of the selected row; and
- sensing a current flowing through the column lines that are coupled with the e-fuses of the selected columns.

* * * * *